(12) United States Patent
Kinoshita et al.

(10) Patent No.: US 7,668,002 B2
(45) Date of Patent: Feb. 23, 2010

(54) RESISTANCE MEMORY ELEMENT AND NONVOLATILE SEMICONDUCTOR MEMORY

(75) Inventors: Kentaro Kinoshita, Kawasaki (JP); Tetsuro Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/021,318

(22) Filed: Jan. 29, 2008

(65) Prior Publication Data

US 2008/0117664 A1    May 22, 2008

Related U.S. Application Data

(63) Continuation of application No. PCT/JP2005/013970, filed on Jul. 29, 2005.

(51) Int. Cl.
*G11C 7/00*    (2006.01)
(52) U.S. Cl. ...................................... 365/148; 365/149
(58) Field of Classification Search ................. 365/148, 365/149
See application file for complete search history.

(56) References Cited

U.S. PATENT DOCUMENTS

| | | | |
|---|---|---|---|
| 4,523,301 A * | 6/1985 | Kadota et al. ............ | 365/49.11 |
| 6,872,963 B2 | 3/2005 | Kostylev et al. | |
| 2004/0026730 A1 | 2/2004 | Kostylev et al. | |

| | | | |
|---|---|---|---|
| 2004/0184318 A1 | 9/2004 | Morikawa | |

FOREIGN PATENT DOCUMENTS

| JP | 2004-253115 A | 9/2004 |
|---|---|---|
| JP | 2004-253115 A1 | 9/2004 |
| JP | 2005-123361 A | 5/2005 |
| WO | 97/05665 A1 | 2/1997 |

OTHER PUBLICATIONS

A. Beck et al; "Reproducible switching effect in thin oxide films for memory applications"; Appl. Phys. Lett., vol. 77, pp. 139-141 (2000).
W. W. Zhuang et al; "Novell Colossal Magnetoresistive Thin Film Nonvolatile Resistance Random Access Memory (RRAM)"; Tech. Digest IEDM 2002, pp. 193-196.
I. G. Baek et al; "Highly Scalable Non-volatile Resistive Memory using Simple Binary Oxide Driven by Asymmetric Unipolar Voltage Pulses"; Tech. Digest IEDM 2004, p. 587.
International Search Report of PCT/JP2005/013970, date of mailing Oct. 18, 2005.
Korean Office Action dated May 13, 2009, issued in corresponding Korean Application No. 10-2008-7000899.

* cited by examiner

*Primary Examiner*—Michael T Tran
(74) *Attorney, Agent, or Firm*—Westerman, Hattori, Daniels & Adrian, LLP (57) ABSTRACT

A resistance memory element, which memorizes a high resistance state and a low resistance state and switches between the high resistance state and the low resistance state by an application of a voltage, includes a pair of electrodes and a resistance memory layer sandwiched between the pair of electrodes and including a first layer of a first resistance memory material and a second layer of a second resistance memory material. The current value of the resistance memory element in the writing operation can be drastically decreased, and a nonvolatile semiconductor memory device of high integration and low electric power consumption can be formed.

14 Claims, 12 Drawing Sheets

RESISTANCE MEMORY ELEMENT AND NONVOLATILE SEMICONDUCTOR MEMORY

CROSS REFERENCE TO RELATED APPLICATIONS

This application is a Continuation of International Application No. PCT/JP2005/013970, with an international filing date of Jul. 29, 2005, which designating the United States of America, the entire contents of which are incorporated herein by reference.

TECHNICAL FIELD

The present invention relates to a resistance memory element and a nonvolatile semiconductor memory device.

BACKGROUND

Recently, as a new memory device, a nonvolatile semiconductor memory device called RRAM (Resistance Random Access Memory) is noted. The RRAM uses a resistance memory element which can memorize a plurality of resistance states of different resistance values, which are changed by electric stimulations applied from the outside and whose high resistance state and low resistance state are corresponded to, e.g., information "0" and "1" to be used as a memory element. The RRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known.

The nonvolatile semiconductor memory device using the resistance memory element is disclosed in, e.g., International Publication No. WO97/05665, U.S. Pat. No. 6,872,963, A. Beck et al., Appl. Phys. Lett., Vol. 77, p. 139 (2001), W. W. Zhuang et al., Tech. Digest IEDM 2002, p. 193, and I. G. Baek et al., Tech. Digest IEDM 2004, p. 587.

SUMMARY

According to one aspect of the present invention, there is provided a resistance memory element which memorizes a high resistance state and a low resistance state and switches between the high resistance state and the low resistance state by an application of a voltage, having: a pair of electrodes; and a resistance memory layer sandwiched between the pair of electrodes, and including a first resistance memory material and a second resistance material different from the first resistance memory material.

DETAILED DESCRIPTION OF THE INVENTION

A First Embodiment

The resistance memory element and the nonvolatile semiconductor memory device according to a first embodiment of the present invention will be explained with reference to FIGS. 1 to 9H.

Figure 1:
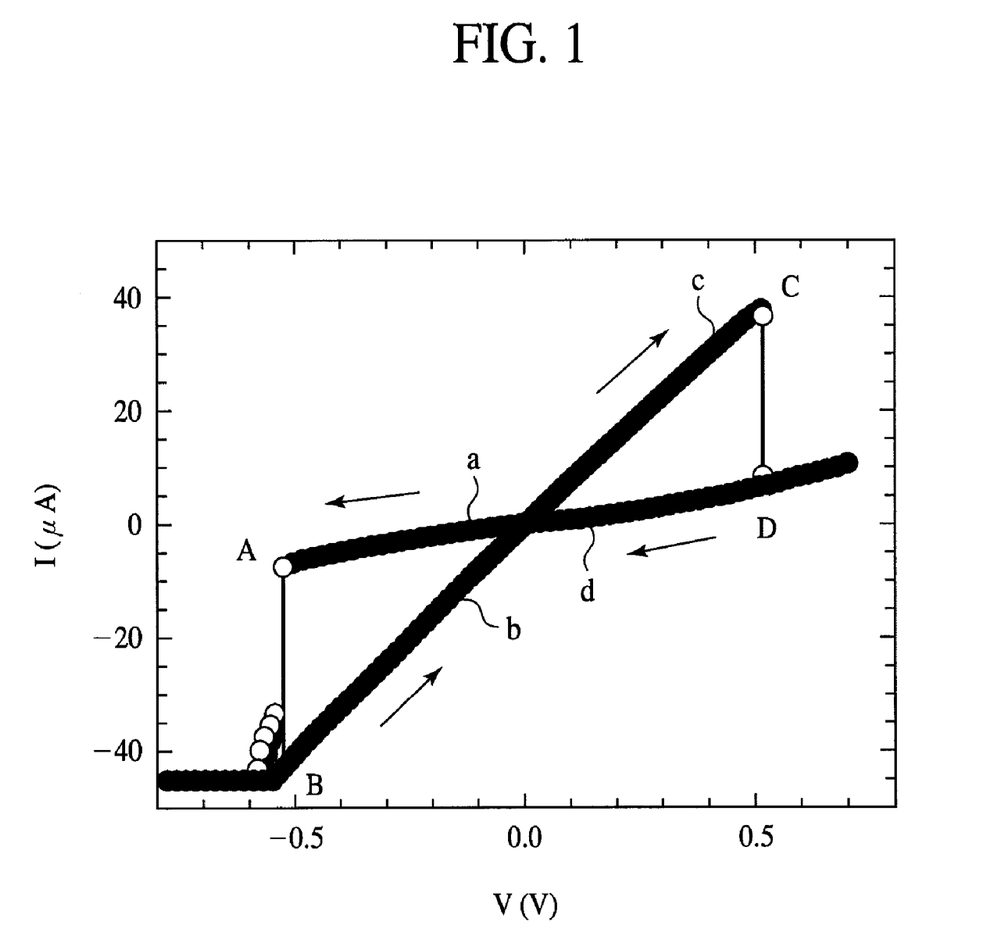
FIG. 1 is a graph showing the current-voltage characteristics of the resistance memory element using a bipolar resistance memory material.
Figure 2:
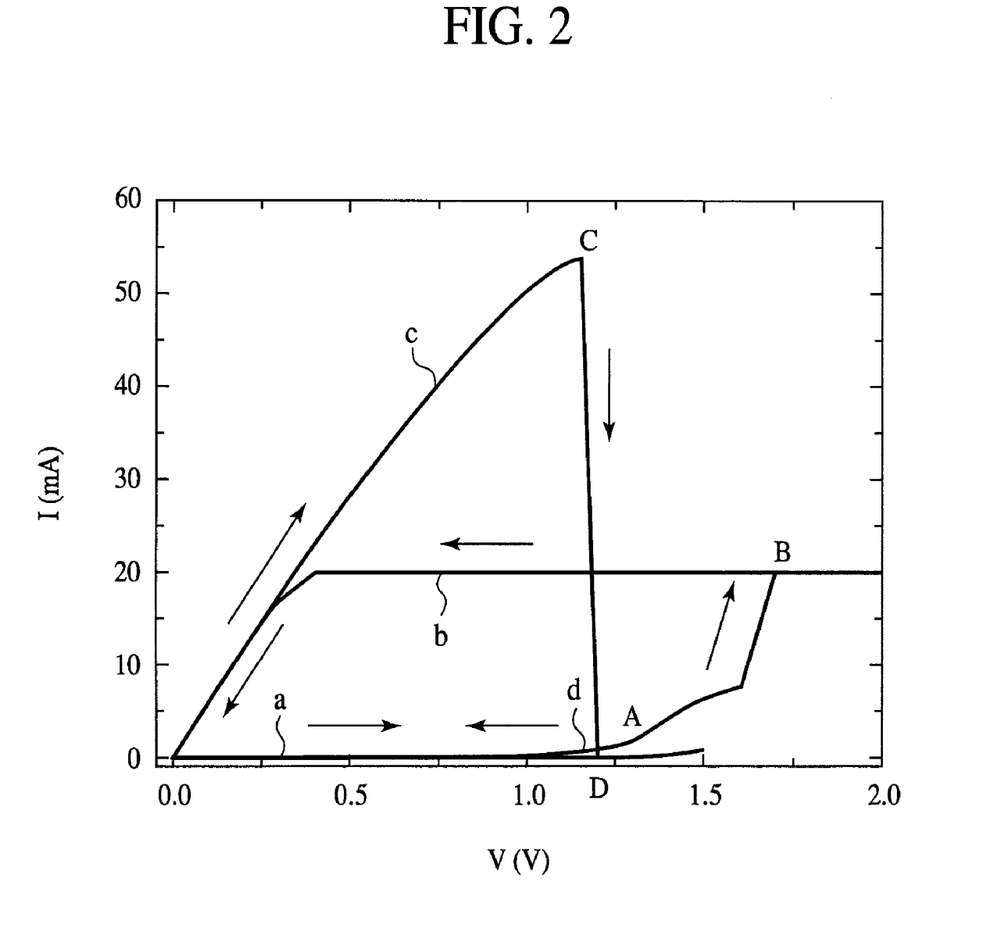
FIG. 2 is a graph showing the current-voltage characteristics of the resistance memory element using a unipolar resistance memory material.
Figure 3:
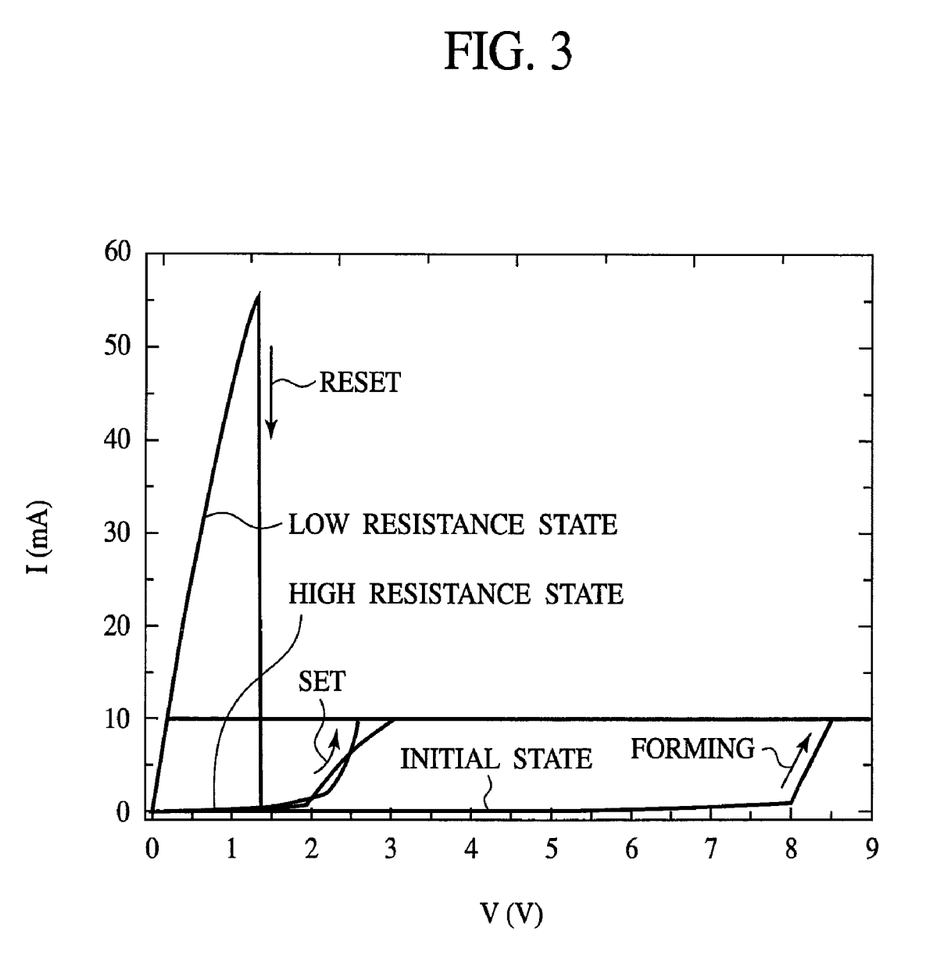
FIG. 3 is a graph showing the current-voltage characteristics of the resistance memory element using a unipolar resistance memory material, which explains the forming process thereof.
Figure 4:
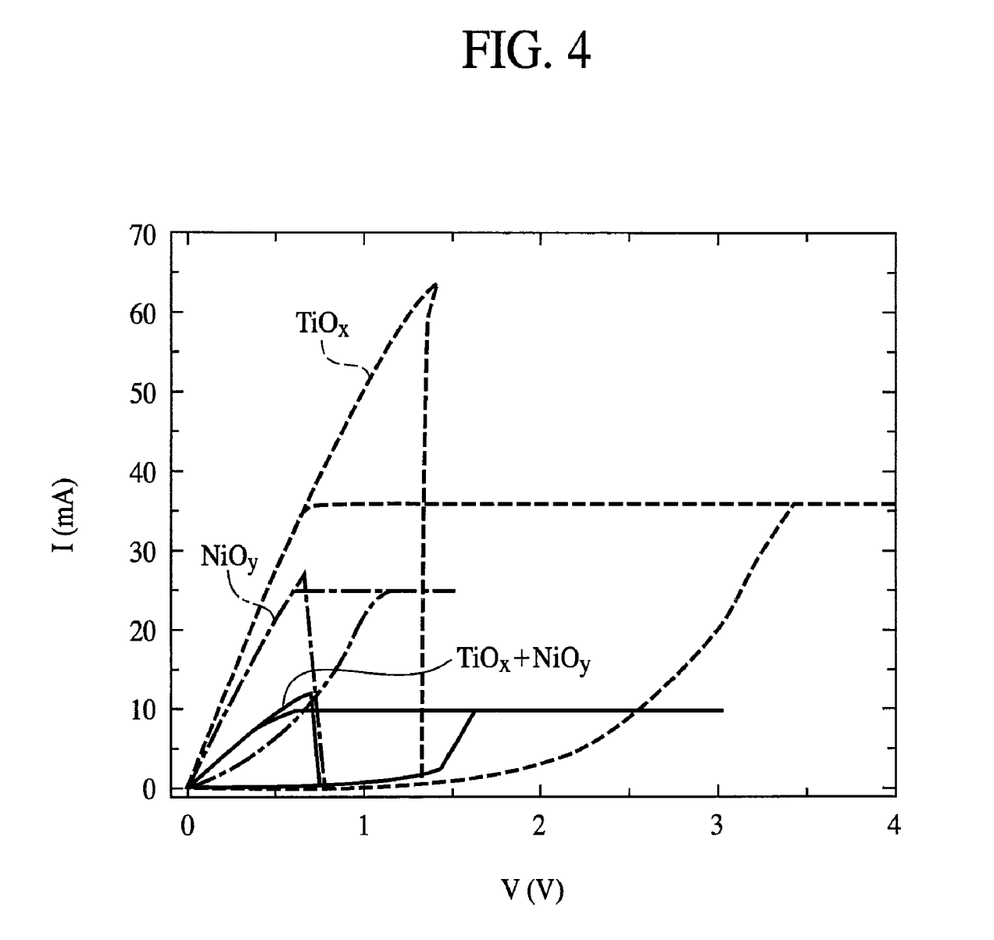
FIG. 4 is a graph showing the current-voltage characteristics of the resistance memory elements of different resistance memory layers.
Figure 5:
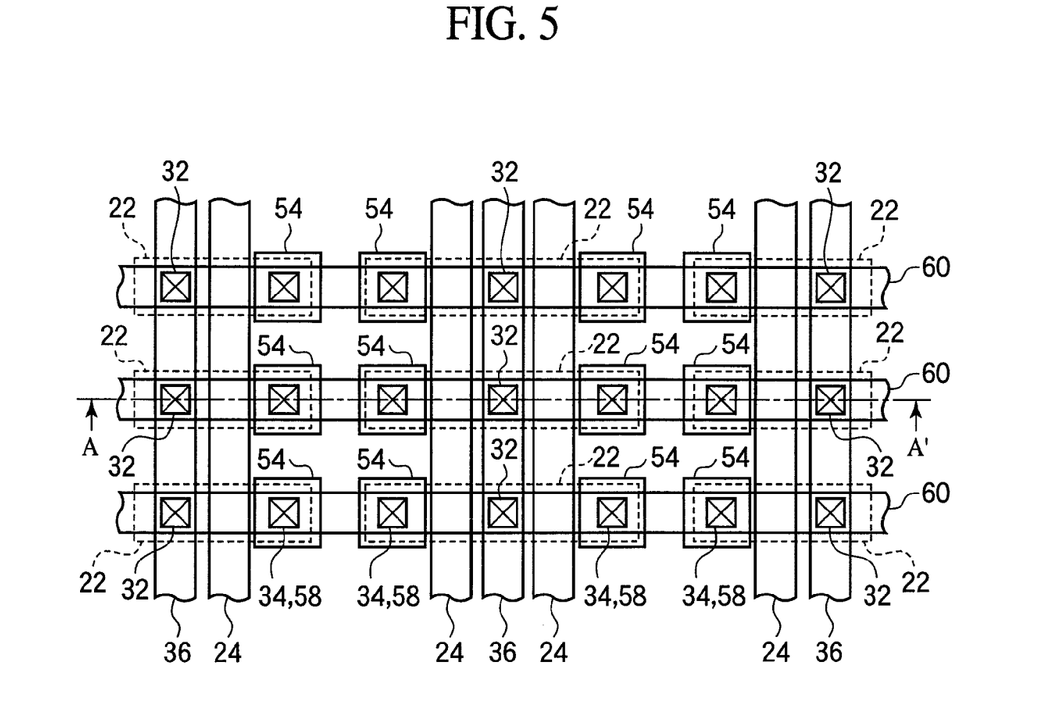
FIG. 5 is a plan view showing the structure of the nonvolatile semiconductor memory device according to a first embodiment of the present invention.
Figure 6:
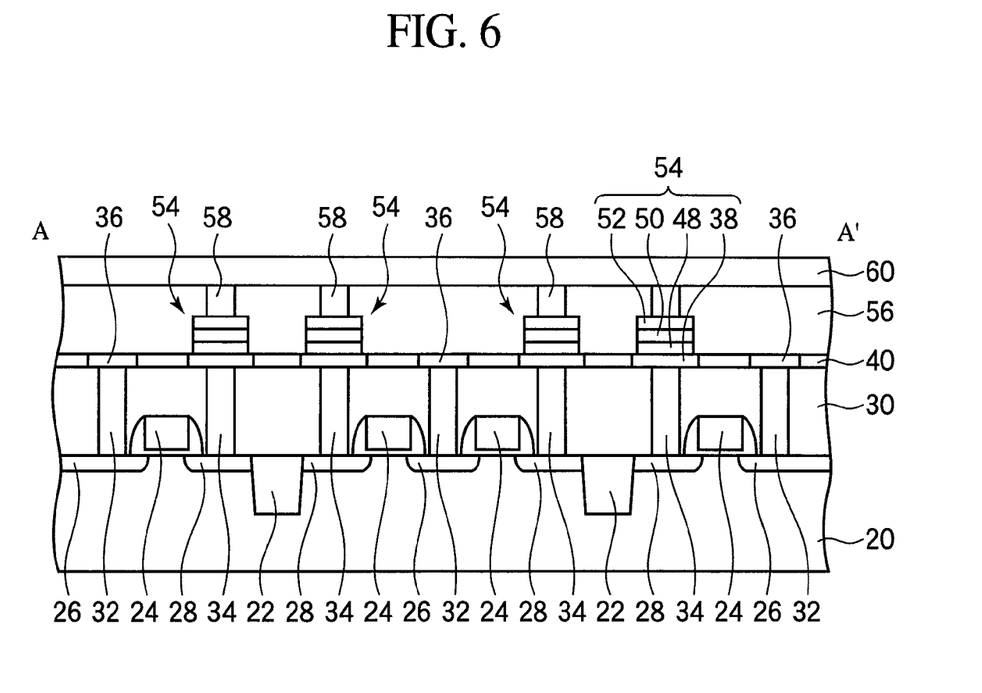
FIG. 6 is a diagrammatic sectional view showing the structure of the nonvolatile semiconductor memory device according to the first embodiment of the present invention.
Figure 7:
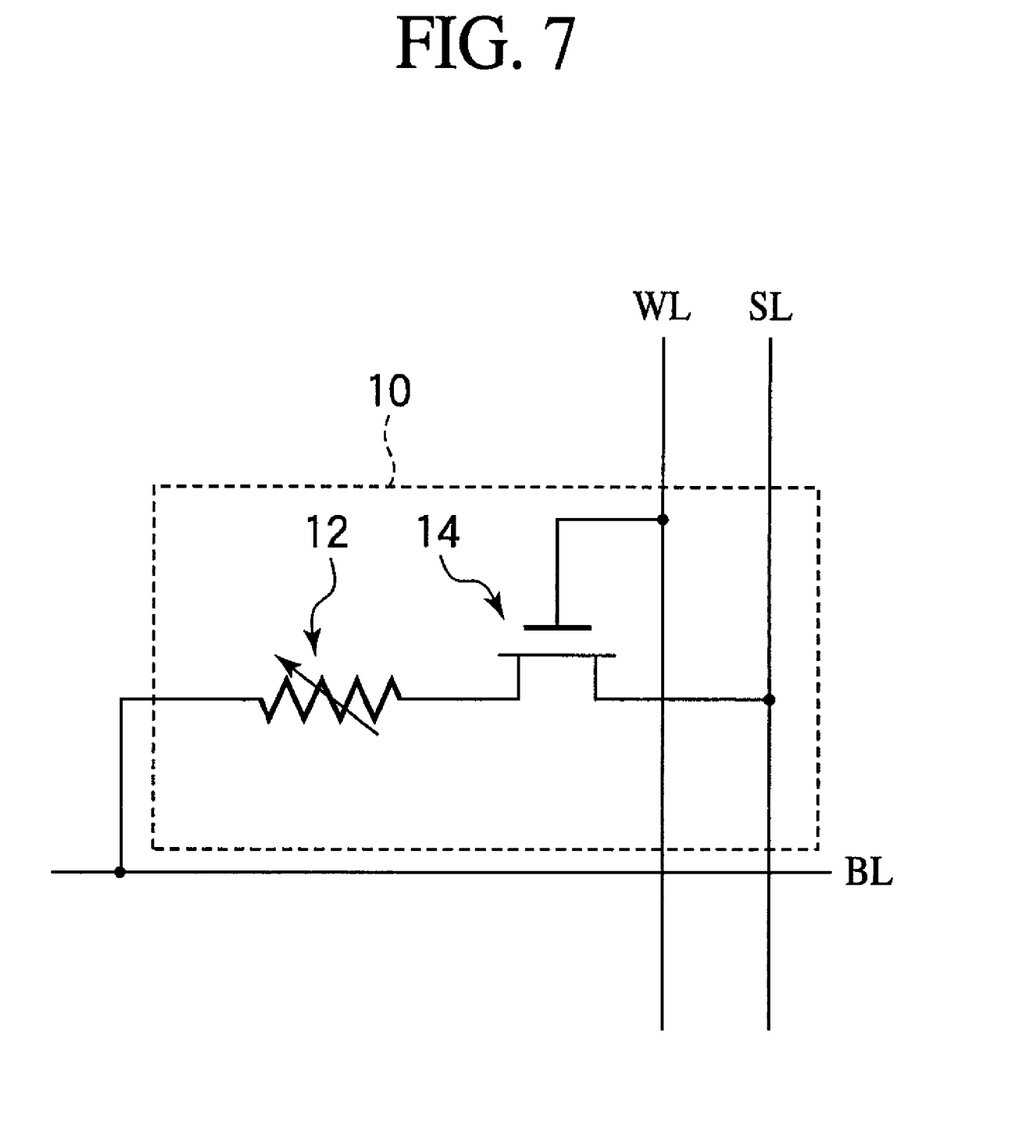
FIGS. 7 and 8 are circuit diagrams showing the structure of the nonvolatile semiconductor memory device according to the first embodiment of the present invention.
Figure 8:
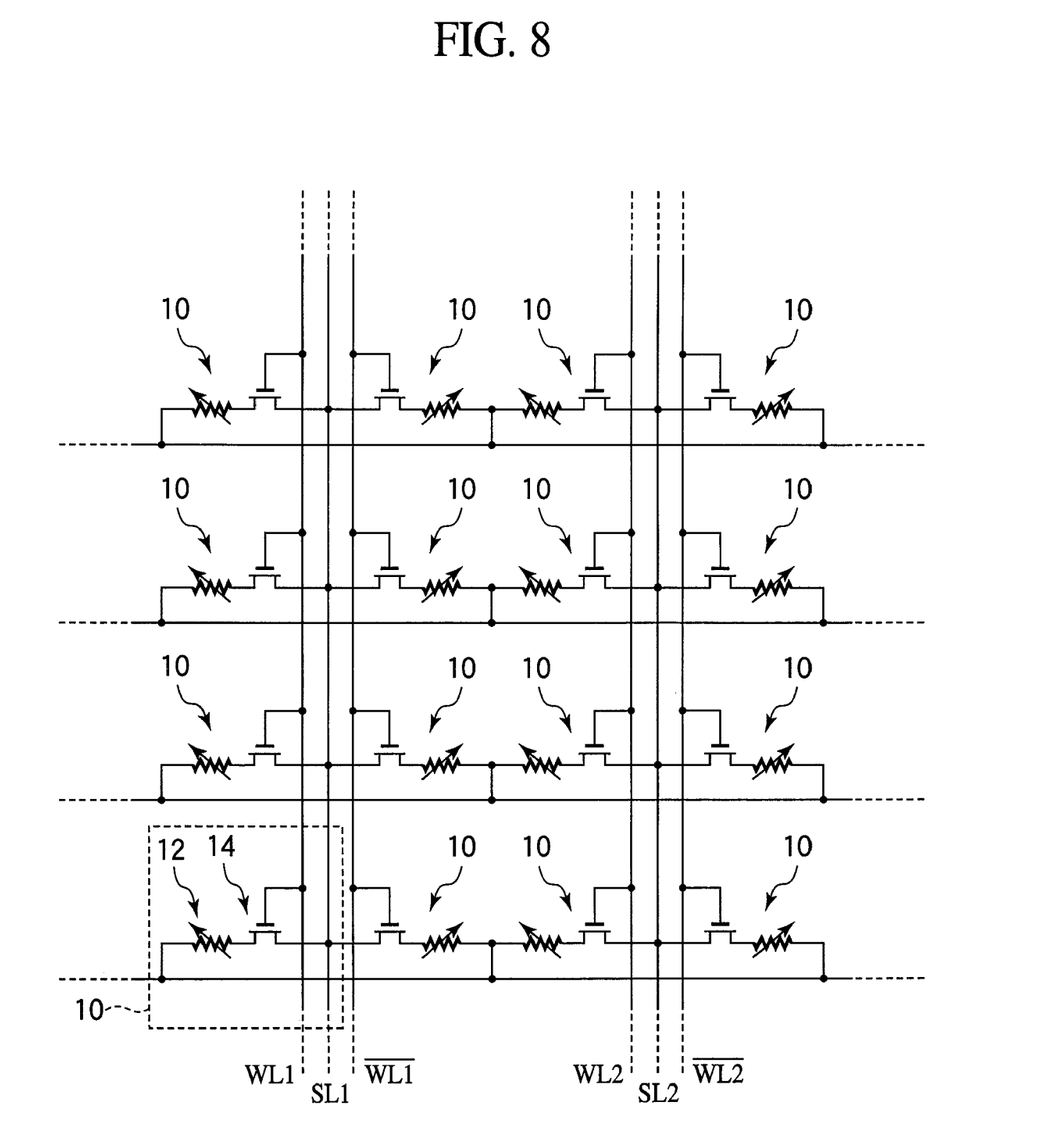

FIG. 1 is a graph showing the current-voltage characteristics of the resistance memory element using a bipolar resistance memory material. FIG. 2 is a graph showing the current-voltage characteristics of the resistance memory element using a unipolar resistance memory material. FIG. 3 is a graph showing the current-voltage characteristics of the resistance memory element using a unipolar resistance memory material, which explains the forming process thereof. FIG. 4 is a graph showing the current-voltage characteristics of the resistance memory elements of different resistance memory layers. FIG. 5 is a plan view showing the structure of the nonvolatile semiconductor memory device according to the present embodiment. FIG. 6 is a diagrammatic sectional view showing the structure of the nonvolatile semiconductor memory device according to the present embodiment. FIGS. 7 and 8 are circuit diagrams showing the structure of the nonvolatile semiconductor memory device according to the present embodiment. FIGS. 9A-9H are sectional views showing the method of manufacturing the nonvolatile semiconductor memory device according to the present embodiment.

First, the basic operation of the resistance memory element will be explained with reference to FIGS. 1 and 2.

The resistance memory element includes the resistance memory material sandwiched between a pair of electrodes. Many of the resistance memory material are oxide materials containing transition metals, and the resistance memory material is divided largely in two, depending on differences in the electric characteristics.

One of them uses voltages of different polarities so as to change the resistance states between the high resistance state and the low resistance state and includes $SrTiO_3$ and $SrZrO_3$ doped with a trace of an impurity, such as chrome (Cr) or others, and $Pr_{1-x}Ca_xMnO_3$ and $La_{1-x}Ca_xMnO_3$, etc., which exhibit CMR (Colossal Magneto-Resistance). Such resistance memory material which requires voltages of different polarities so as to rewrite the resistance state will be hereinafter called the bipolar resistance memory material.

The other of them is materials which require voltages of the same polarity so as to change the resistance states between the high resistance state and the low resistance state and includes oxides, etc., containing a single transition metal, such as $NiO_x$ and $TiO_x$. Such resistance memory materials which require voltages of the same polarity for rewriting the resistance states will be hereinafter called the unipolar resistance memory material.

FIG. 1 is a graph of the current-voltage characteristics of the resistance memory element using the bipolar resistance memory material and is disclosed in Reference 2. This graph is of the resistance memory element using Cr-doped $SrZrO_3$, which is the typical bipolar resistance memory material.

It is assumed that in the initial state, the resistance memory element is in the high resistance state.

As an applied voltage increases gradually from 0 V to negative voltages, the current flowing at this time changes along the curve "a" in the arrowed direction, and its absolute value gradually increases. When the applied negative voltage is further increased and exceed about −0.5 V, the resistance memory element switches from the high resistance state to the low resistance state. Accompanying this, the absolute value of the current abruptly increases, and the current-voltage characteristics transits from the point A to the point B. In the following explanation, the operation of changing the resistance memory element from the high resistance state to the low resistance state is called "set".

As the negative voltage is gradually decreased from the state at the point B, the current changes along the curve "b" in the arrowed direction, and its absolute value gradually decreases. When the applied voltage returns to 0 V, the current also becomes 0 A.

As the applied voltage increases gradually from 0 V to positive voltages, the current value changes along the curve "c" in the arrowed direction, and its absolute values gradually increases. The applied positive voltage further increases and exceeds about 0.5 V, the resistance memory element switches from the low resistance state to the high resistance state. Accompanying this, the absolute value of the current abruptly decreases, and the current-voltage characteristics transit from the point C to the point D. In the following explanation, the operation of changing the resistance memory element from the low resistance state to the high resistance state is called "reset".

As the positive voltage decreases from the state at the point D, the current changes along the curve "d" in the arrowed direction, and its absolute value gradually decreases. When the applied voltage returns to 0 V, the current also becomes 0 A.

The respective resistance states are stable in the range of about ±0.5 V and can be retained even when the electric power source is turned off. That is, in the high resistance state, when an applied voltage is lower than the absolute value of the voltage at the point A, the current-voltage characteristics changes linearly along the curves "a" and "d", and the high resistance state is retained. Similarly, in the low resistance state, when an applied voltage is lower than the absolute value of the voltage at the point C, the current-voltage characteristics changes linearly along the curves "b" and "c", and the low resistance state is retained.

As described above, for the resistance memory element using the bipolar resistance memory material, to change the resistance state between the high resistance state and the low resistance state, voltages of different polarities are applied.

FIG. 2 is a graph of the current-voltage characteristics of the resistance memory element using the unipolar resistance memory material. This graph is of the resistance memory element using $TiO_x$, which is the typical unipolar resistance memory material.

It is assumed that in the initial state, the resistance memory element is in the high resistance state.

As an applied voltage is increased gradually from 0 V, the current increases along the curve "a" in the arrowed direction, and its absolute value gradually increases. When the applied voltage gradually increases and exceeds about 1.3 V, the resistance memory element is switched from the high resistance state to the low resistance state (set). Accompanying this, the absolute value of the current abruptly increases, and the current-voltage characteristics transit from the point A to the point B. In FIG. 2, the current value at the point B is constantly about 20 mA because of the current limiter for preventing the element from breaking due to abrupt current increases.

As the voltage decreases gradually from the state at the point B, the current changes along the curve "b" in the arrowed direction, and its absolute value gradually decreases. When the applied voltage returns to 0 V, the current also becomes 0 A.

As the applied voltage again increases gradually from 0 V, the current changes along the curve "c" in the arrowed direction, and its absolute value gradually increases. When the applied positive voltage further increases and exceeds about 1.2 V, the resistance memory element is switched from the low resistance state to the high resistance state (reset). Accompanying this, the absolute value of the current abruptly decreases, and the current-voltage characteristics transits from the point C to the point D.

As the voltage is decreased gradually from the point D, the current changes in the arrowed direction along the curve "d", and the absolute value is gradually decreased. When the applied voltage returns to 0 V, the current also becomes 0 A.

The respective resistance states are stable not more than about 1.0 V and are retained when the electric power is turned off. That is, in FIG. 2, both states are stable not more than about 1.0 V and are retained even when the source power is turned off. That is, in the high resistance state, when the applied voltage is below the voltage at the point A, the current-voltage characteristics linearly change along the curve "a", and the high resistance state is retained. Similarly, in the low resistance state, when the applied voltage is below the voltage at the point C, the current-voltage characteristics change along the curve "c", and the low resistance state is retained.

As described above, in the resistance memory element using the unipolar resistance memory material, to change the resistance state between the high resistance state and the low resistance state, voltages of the same polarity are applied.

The resistance memory element formed of the above-described material cannot have the characteristics shown in FIGS. 1 and 2 in the initial state immediately after the element formation. To make the resistance memory material reversibly changeable between the high resistance state and the low resistance state, the processing called "forming" is necessary.

FIG. 3 shows the current-voltage characteristics explaining the forming process of the resistance memory element using the same unipolar resistance memory material as in FIG. 2.

In the initial state immediately after the element has been formed, as shown in FIG. 3, the element is highly resistive and has a breakdown voltage of about 8 V which is very high. This breakdown voltage is very high in comparison with voltages necessary for the setting and resetting. In the initial state, changes of the resistance state, such as the setting and resetting, do not take place.

When a voltage higher than the breakdown voltage is applied in the initial state, as shown in FIG. 3, the value of the current flowing through the element abruptly increases, that is, the forming of the resistance memory element is made. Such forming is made, whereby the resistance memory element exhibits the current-voltage characteristics shown in FIG. 2 and can switch reversibly between the low resistance state and the high resistance state. Once subjected to the forming, the resistance memory element does not return to the initial state.

The resistance memory element in the initial state before subjected to the forming has a high resistance value, and this high resistance state might be misunderstood to be the high resistance state after the forming. Then, in the specification of the present application, the high resistance state means the high resistance state of the resistance memory element after subjected to the forming, the low resistance state means the low resistance state of the resistance memory element after subjected to the forming, and the initial state is the state of the resistance memory element before subjected to the forming.

In the writing operation of the resistance memory element, it is necessary to flow large current in the resistance memory element. Especially, the resetting current tends to be larger for the resistance memory element using the unipolar resistance memory material than the resistance memory element using the bipolar resistance memory material.

Large current value for the writing operation means large electric power consumption. To drive large current, the peripheral elements must have large sizes. To form a nonvolatile semiconductor memory device of high integration and low electric power consumption using the resistance memory element, it is necessary to decrease the current value in the writing operation of the resistance memory element.

From such viewpoint, the inventors have made earnest studies and for the first time have made it evident that a resistance memory element including two or more layers of a resistance memory material stacked on each other can decrease the current value in the writing operation.

FIG. 4 shows the current-voltage characteristics of the resistance memory element using various unipolar resistance memory materials. In the graph, the dotted line is for the resistance memory element using a 60 nm-thickness $TiO_x$ as the resistance memory material, the one dot chain line is for the resistance memory element using a 60 nm-thickness $NiO_x$ as the resistance memory material, and the solid line is for the resistance memory element using the layer film of a 60 nm-thickness $TiO_x$ and a 60 nm-thickness $NiO_x$ film as the resistance memory material. In all the resistance memory elements, the upper electrode and the lower electrode sandwiching the resistance memory material were platinum (Pt) electrode. The current limitation value for the samples was set based on the lowest value given by measuring plural samples prepared under the same conditions, which can switch most of the elements.

As shown in FIG. 4, in the resistance memory element using $TiO_x$, the current value necessary for the setting (the set value of the current limitation) is about 36 mA, and the peak current in the resetting is about 64 mA. In the resistance memory element using $NiO_x$, the current value necessary for the setting is about 25 mA, and the peak current in the resetting is about 27 mA. In contrast to this, in the resistance memory element using the layer film of $TiO_x$ and $NiO_x$, the current value necessary for the setting and the peak current in the resetting can be decreased respectively to about 10 mA and to about 12 mA.

That is, the resistance memory element using the layer film of $TiO_x$ and $NiO_x$ can reduce both the peak current in the resetting and the current in the setting.

Of the samples used in the measurement of FIG. 4, the resistance memory elements using $TiO_x$ and the resistance memory element using $NiO_x$ have a 60 nm-thickness of the resistance memory materials, but the resistance memory element using the layer film of $TiO_x$ and $NiO_x$ has a 120 nm-thickness of the resistance memory material, which is thicker. However, the above-described resistance value decrease found in the resistance memory element using the layer film of $TiO_x$ and $NiO_x$ is not due to the simple resistance increase by the film thickness increase of the resistance memory layer.

When it is assumed that the current flowing in the resistance memory element of the low resistance state is inversely proportional to the film thickness as is that of the usual resistor, the resistance value of the resistance memory element using $TiO_x$ doubles with the film thickness of the resistance memory element using $TiO_x$ doubled to 120 nm is doubled, and the current, which is proportional to its inverse number is ½ time. That is, the peak current value to flow in the resetting is estimated to be 64 mA/2=32 mA. Similarly, with the film thickness of the resistance memory element using $NiO_x$ doubled to 120 nm, the peak current value to flow in the resetting is estimated to be 27 mA/2=13.5 mA. These peak current values are both large than the peak current (about 12 mA) of the resistance memory element using the layer film of $TiO_x$ and $NiO_x$ in the resetting. That is, the effect of the writing current decrease of the resistance memory element using the resistance memory layer of the layer structure is a characteristic effect which cannot be given by the resistance memory element including the resistance memory layer of the single layer structure.

The mechanism for the current value in the setting and resetting being decreased by the resistance memory layer of the layer structure is not clear, but the inventors of the present invention guess that at least one layer of the resistance memory layers acts to accelerate the switching operation. One of the models of accelerating the switching operation will be acceleration of the oxidation reaction in the resetting operation.

The resistance memory element is formed and is subjected to the forming processing to cause the dielectric breakdown, and a cylindrical deteriorated region is formed in the resistance memory layer. The current path is formed in this deteriorated region. This state is the low resistance state of the resistance memory element.

When a voltage is applied to the resistance memory element in the low resistance state, current flows via the above-described current path. When the value of the current becomes large, an oxidation reaction similar to the anodic oxidation in the current path acts to return the deteriorated region to the original state. Then, the deteriorated region is decreased, whereby the current path is narrowed, or the oxidation advances with the vicinity of the electrode interface of the path as the center, whereby the current path is blocked, and high resistance is produced. This state is the high resistance state of the resistance memory element.

When a voltage of not less than a prescribed value is applied to the resistance memory element in the high resistance state, the dielectric breakdown takes place in the oxidized region blocking the current path, and the current path is formed again. Thus, the resistance memory element returns to the low resistance state.

In the above-described writing operation of the resistance memory element, the resistance memory layer of the layer structure will accelerate mainly the oxidation reaction in the resetting operation. The effect of accelerating the oxidation reaction is due to that at least one layer of the resistance memory layer acts as a layer which supplies oxygen to the other layer to accelerate the oxidation reaction (oxygen supply layer). The presence of the oxygen supply layer in the resistance memory layer accelerates the oxidation reaction in the current path in the resistance memory layer to thereby make the resetting operation with less current.

In the above-described resistance memory element including the layer film of $TiO_x$ and $NiO_x$, the $TiO_x$ layer will mainly play the role of the oxygen supply layer, which accelerates the oxidation reaction in the $NiO_x$ layer.

The inventors of the present invention investigated the layer film of $ZrO_x$ and $NiO_x$ in addition to the layer film of $TiO_x$ and $NiO_x$, and in this case as well, the writing current decreasing effect could be also produced. In the layer film of $ZrO_x$ and $NiO_x$, the $ZrO_x$ layer will mainly play the role of the oxygen supply layer, which accelerates the oxidation reaction in the $NiO_x$ layer. $ZrO_x$ is an ionic conductive material, and due to this property, the supply of oxygen ions to the $NiO_x$ layer will be accelerated.

The resistance memory material can be $TiO_x$, $NiO_x$, $YO_x$, $CeO_x$, $MgO_x$, $ZnO_x$, $WO_x$, $NbO_x$, $TaO_x$, $CrO_x$, $MnO_x$, $AlO_x$, $VO_x$, $CuO_x$, $SiO_x$, etc. When the resistance memory layer of the layer structure is formed, these materials are suitably combined in consideration of their properties so that at least one layer acts as the oxygen supply layer. The resistance memory layer can be a layer structure of not only two layers but also three or more layers.

Then, the structure of the nonvolatile semiconductor memory device according to the present embodiment will be explained with reference to FIGS. 5 to 8.

As shown in FIGS. 5 and 6, in a silicon substrate 20, a device isolation film 22 is formed. In device regions of the silicon substrate 20, cell select transistors each including a gate electrode 24 and source/drain regions 26, 28 are formed.

As shown in FIG. 5, the gate electrodes 24 function as word lines WL commonly connecting the gate electrodes 24 of the cell select transistors adjacent to each other column-wise (vertically in the drawing).

Over the silicon substrate 20 with the cell select transistors formed on, an inter-layer insulating film 30 with contact plugs 32 electrically connected to the source/drain regions 26, and contact plugs 34 electrically connected to the source/drain regions 28 buried in is formed.

Over the inter-layer insulating film 30 with the contact plugs 32, 34 buried in, source lines 36 electrically connected to the source/drain regions 26 via the contact plugs 32, and resistance memory elements 54 electrically connected to the source/drain regions 28 via the contact plugs 34 are formed.

As shown in FIG. 6, the resistance memory elements 54 each include a lower electrode 38 connected to the contact plugs 34, a resistance memory layer 48 of $TiO_x$ formed on the lower electrodes 38, a resistance memory layer 50 $NiO_x$ film formed on the resistance memory layer 48, and an upper electrode 52 formed on the resistance memory layer 50.

Over the inter-layer insulating film 30 with the source lines 46 and the resistance memory elements 54 formed on, inter-layer insulating films 40, 56 with contact plugs 58 electrically connected to the resistance memory element 54 are formed.

Over the inter-layer insulating film 56 with the contact plugs 58 buried in, bit lines 60 electrically connected to the upper electrodes 52 of the resistance memory elements 54 via the contact plugs 58 are formed.

As described above, the nonvolatile semiconductor memory according to the present embodiment is characterized mainly in that the resistance memory elements 54 have the layer structure of the resistance memory layer 48 of $TiO_x$ and the resistance memory layer 50 of $NiO_x$. The resistance memory layer is formed of the layer structure of $TiO_x$ and $NiO_x$, whereby the current value in the writing operation can be much decreased. Thus, the nonvolatile semiconductor memory device of high integration and low electric power consumption can be formed.

The memory cell 10 of the nonvolatile semiconductor memory device according to the present embodiment shown in FIGS. 5 and 6 includes, as shown in FIG. 7, the resistance memory element 12 and the cell select transistor 14. The resistance memory element 12 has one terminal connected to the bit line BL and the other terminal connected to the drain terminal of the cell select transistor 14. The cell select transistor has the source terminal connected to the source line SL and the gate terminal connected to the word line WL.

FIG. 8 is a circuit diagram of one example of the memory cell array of the memory cells 10 arranged in a matrix. A plurality of memory cells 10 is formed adjacent to each other column-wise (vertically in the drawing) and row-wise (transversely in the drawing).

A plurality of word lines WL1, /WL1, WL2, /WL2, . . . are arranged column-wise, forming common signals for the memory cells 10 arranged column-wise. The source lines SL1, SL2, . . . are arranged column wise, forming common signal lines for the memory cells 10 arranged column-wise. The source lines SL are arranged one for two word lines WL.

A plurality of the bit lines BL1, BL2, BL3, BL4, . . . are arranged row-wise (transversely in the drawing), forming common signal lines for the memory cells 10 arranged row-wise.

Then, the method of writing into the nonvolatile semiconductor memory device according to the present embodiment will be explained with reference to FIG. 8.

First, the rewriting operation from the high resistance state to the low resistance state, i.e., the setting operation will be explained. The memory cell 10 to be rewritten is a memory cell 10 connected to the word line WL1 and the bit line BL1.

First, a prescribed voltage is applied to the word line WL1 to turn on the cell select transistor 14. The source line SL1 is connected to a reference potential, e.g., 0 V, which is the ground potential.

Next, to the bit line BL1, a bias voltage which is the same as or a little larger than a voltage necessary to set the resistance memory element 12 is applied. For the resistance memory element having the characteristics indicated by, e.g., the solid line in FIG. 4, the bias voltage of, e.g., about 1.5 V is applied.

Thus, a current path to the source line SL1 via the bit line BL1, the resistance memory element 12 and the cell select transistor 14 is formed, and the applied bias voltage is divided into the resistance memory element 12 and to the cell select transistor 12 corresponding to a resistance value $R_H$ of the resistance memory element 12 and a channel resistance $R_{CS}$ of the cell select transistor 14.

At this time, because of the resistance value $R_H$ Of the resistance memory element 12 which is sufficiently large in comparison with the channel resistance $R_{CS}$ of the cell select transistor, most of the bias voltage is applied to the resistance memory element 12. Thus, the resistance memory element 12 changes from the high resistance state to the low resistance state.

Then, after the bias voltage to be applied to the bit line BL1 is returned to zero, the voltage to be applied to the word line WL1 is turned off, and the setting operation is completed.

Next, the rewriting operation from the low resistance state to the high resistance state, i.e., the resetting operation will be explained. The memory cell 10 to be rewritten is a memory cell 10 connected to the word line WL1 and the bit line BL1.

First, a prescribed a voltage is applied to the word line WL1 to turn on the cell select transistor 14. The source line SL1 is connected to a reference potential, e.g., 0 V, which is the ground potential.

Then, a voltage which is the same as or a little larger than a voltage necessary to reset the resistance memory element 12 is applied to the bit line BL1. For the resistance memory element having the characteristics indicated by, e.g., the solid line in FIG. 4, the bias voltage of, e.g., about 0.8 V is applied.

Thus, a current path to the source line SL1 via the bit line BL1, the resistance memory element 12 and the cell select transistor 14 is formed, and the applied bias voltage is divided into the resistance memory element 12 and to the cell select transistor 12 corresponding to a resistance value $R_L$ of the resistance memory element 12 and a channel resistance $R_{CS}$ of the cell select transistor 14.

At this time, because of the channel resistance $R_{CS}$ of the cell select transistor 14 which is sufficiently smaller than the resistance value $R_L$ of the resistance memory element 12, most of the applied bias voltage is applied to the resistance memory element 12. Thus, the resistance memory element 12 changes from the low resistance state to the high resistance state.

In the resetting process, at the instant the resistance memory element 12 has switched to the high resistance state, substantially all the bias voltage is divided into the resistance memory element 12, and accordingly it is necessary to prevent the resistance memory element 12 from being set again by this bias voltage. To this end, the bias voltage to be applied to the bit line BL must be smaller than a voltage necessary for the setting.

That is, in the resetting process, the gate voltage of the cell select transistor 14 is adjusted so that the channel resistance $R_{CS}$ of the cell select transistor 14 is sufficiently smaller than the resistance value $R_L$ of the resistance memory element 12 while the bias voltage to be applied to the bit line BL is set to be not less than the voltage necessary for the resetting and less than the voltage necessary for the setting.

Next, after the bias voltage to be applied to the bit line BL1 has been returned to zero, the voltage to be applied to the word line WL is turned off, and the resetting operation is completed.

In the nonvolatile semiconductor memory device according to the present embodiment, as shown in FIG. 8, the word lines WL and the source lines SL are arranged column-wise, and the memory cells 10 connected to one word line (e.g., WL1) are connected to the same source line SL (e.g., SL1). Accordingly, in the above-described resetting operation, a plurality of the bit lines BL (e.g., BL1-BL4) are simultaneously driven, whereby a plurality of the memory cells 10 connected to the selected word line (e.g., WL1) can be reset at once.

Next, the method of reading the nonvolatile semiconductor memory device according to the present embodiment shown in FIG. 8 will be explained. The memory cell 10 to be read is a memory cell 10 connected to the word line WL1 and the bit line BL1.

First, a prescribed voltage is applied to the word line WL1 to turn on the cell select transistor 14. The source line SL1 is connected to a reference potential, e.g., 0 V, which is the ground potential.

Next, a prescribed bias voltage is applied to the bit line BL1. This bias voltage is set so that the applied voltage causes neither the setting nor resetting even when the resistance memory element 12 is in either resistance state.

When such bias voltage is applied to the bit line BL1, current corresponding to a resistance value of the resistance memory element 12 flows in the bit line BL1. The value of the current flowing in the bit line BL1 is detected, whereby what resistance state the resistance memory element 12 has can be read.

Next, the method of manufacturing the nonvolatile semiconductor memory device according to the present embodiment will be explained with reference to FIGS. 9A to 9H.

Figure 9A:
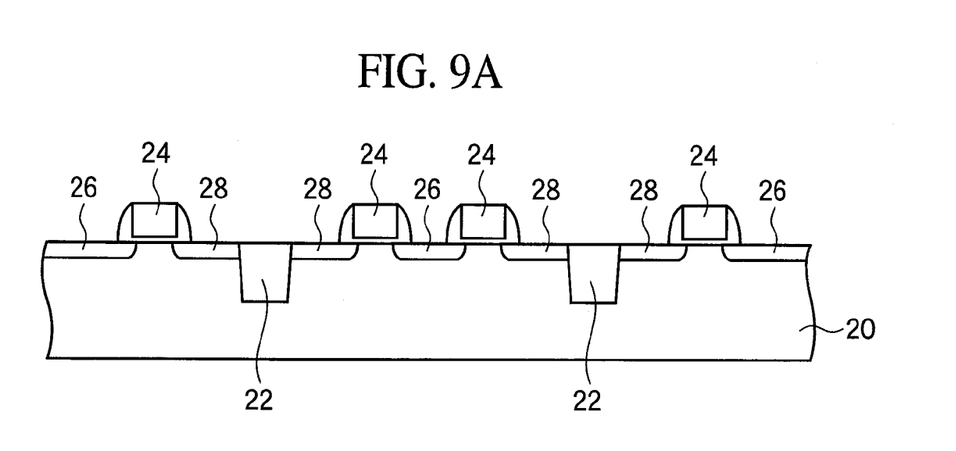
FIGS. 9A-9H are sectional views showing the method of manufacturing the nonvolatile semiconductor memory device according to the first embodiment of the present invention.

First, in the silicon substrate 20, the device isolation film 22 for defining the device regions is formed by, e.g., STI (Shallow Trench Isolation) method.

Next, in the device region of the silicon substrate 20, the cell select transistors each including the gate electrode 24 and the source/drain regions 26, 28 are formed in the same way as in the method of manufacturing the usual MOS transistor (FIG. 9A).

Figure 9B:
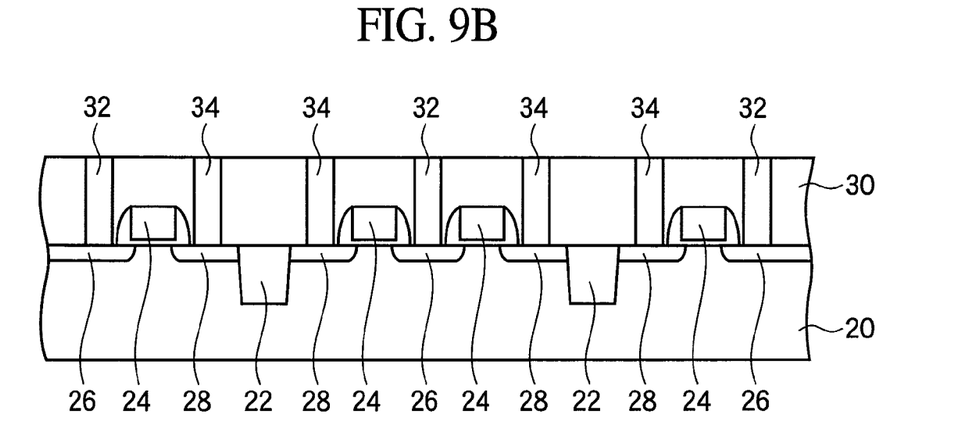

Then, over the silicon substrate 20 with the cell select transistors formed on, a silicon oxide film is deposited by, e.g., CVD method to form the inter-layer insulating film 30 of the silicon oxide film.

Next, by photolithography and dry etching, contact holes down to the source/drain regions 26, 28 are formed in the inter-layer insulating film 30.

Then, a barrier metal and a tungsten film are deposited by, e.g., CVD method, and then these conductive films are etched back to form in the contact holes of inter-layer insulating film 30 the contact plugs 32, 34 electrically connected to the source/drain regions 26, 28 (FIG. 9B).

Figure 9C:
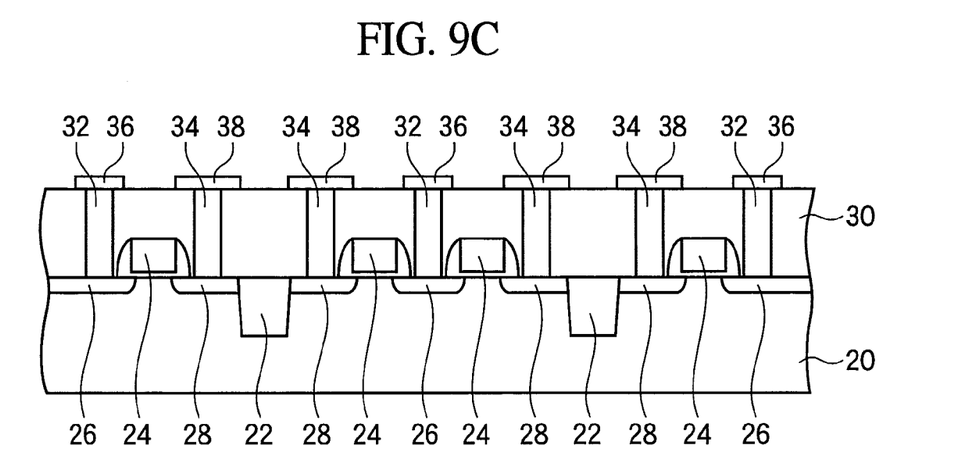

Next, over the inter-layer insulating film 30 with the contact plugs 32, 34 buried in, a platinum (Pt) film is deposited by, e.g., CVD method.

Next, the platinum film is patterned by photolithography and dry etching to form the source lines 36 electrically connected to the source/drain regions 26 via the contact plugs 32 and the lower electrodes 38 electrically connected to the source/drain regions 28 via the contact plugs 32 (FIG. 9C).

Figure 9D:
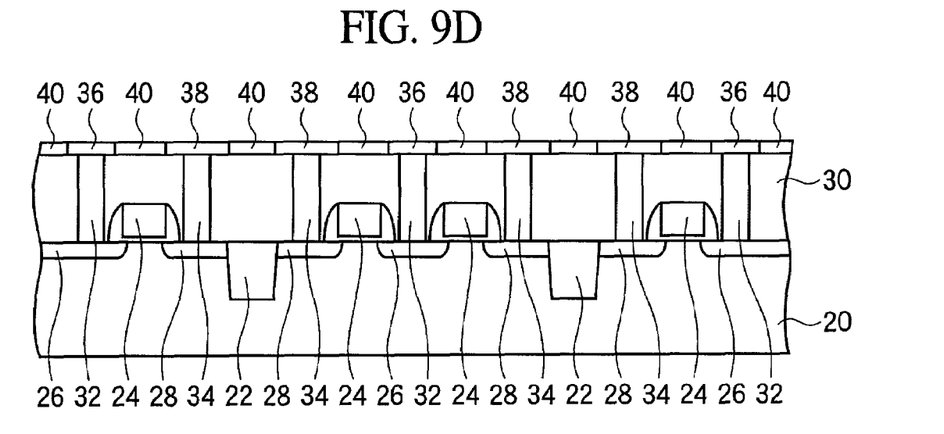

Next, over the inter-layer insulating film 30 with the source lines 36 and the lower electrodes 38 formed in, a silicon oxide film is deposited by, e.g., CVD method.

Next, the silicon oxide film is polished by, e.g., CMP method until the surfaces of the source lines 36 and the lower electrodes 38 are exposed and planarized to form the inter-layer insulating film 40 of the silicon oxide film (FIG. 9D).

Figure 9E:
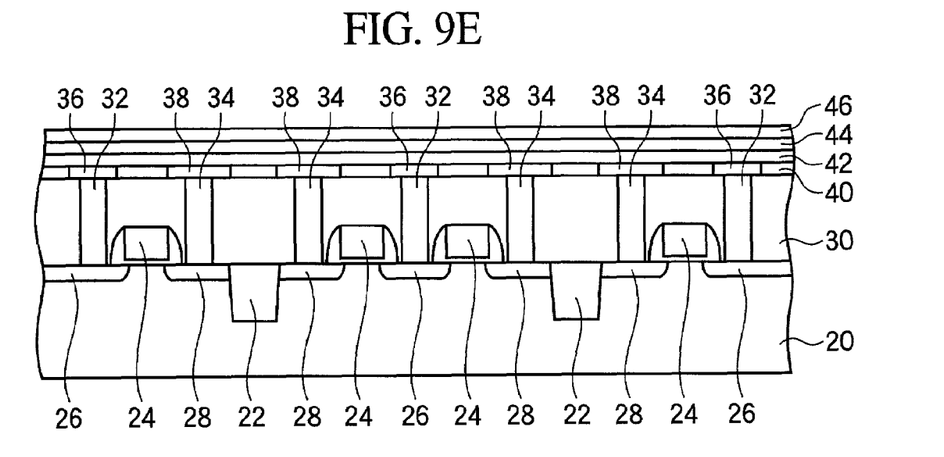

Next, over the entire surface, by laser ablation method, sol-gel method, sputtering method, MOCVD method or others, a 60 nm-thickness $TiO_x$ film 42, for example, a 60 nm-thickness $NiO_x$ film 44, for example, are deposited.

Next, on the $NiO_x$ film 44, a platinum film 46 is deposited by, e.g., CVD method (FIG. 9E).

Figure 9F:
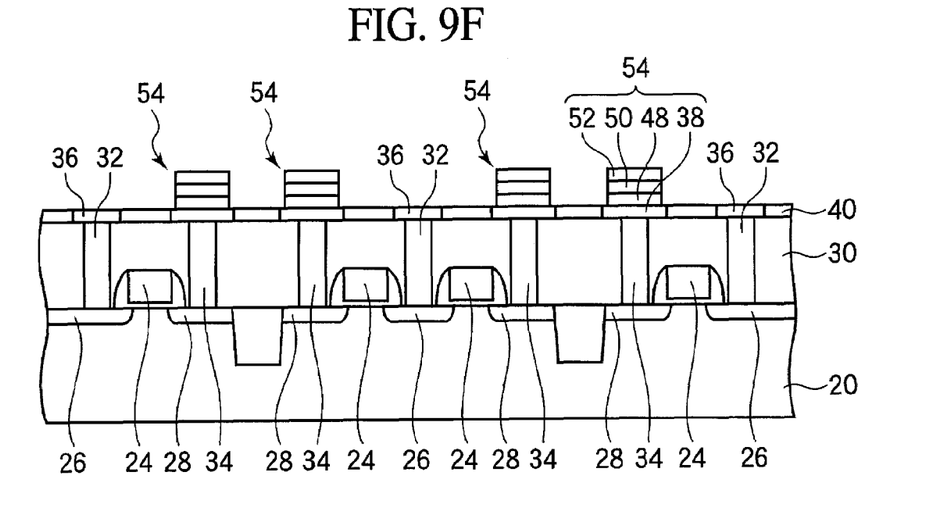

Next, by photolithography and dry etching, the platinum film 46, the $NiO_x$ film 44 and the $TiO_x$ film 42 are patterned to form the resistance memory layer 48 of the $TiO_x$ film 42, the resistance memory layer 50 of the $NiO_x$ film 44 and the upper electrodes 52 of the platinum film 46. Thus, the resistance memory elements 54 each including the lower electrode 38, the resistance memory layers 48, 50 and the upper electrode 52 are formed (FIG. 9F).

Figure 9G:
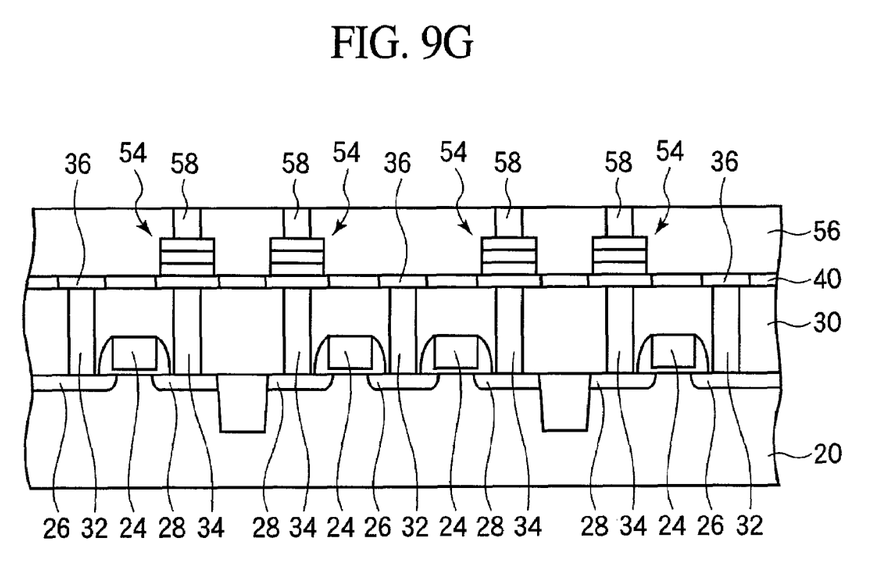

Then, a silicon oxide film is deposited by, e.g., CVD method, and then the surface of the silicon oxide film is planarized by, e.g., CMP method to form the inter-layer insulating film 56 of the silicon oxide film.

Next, by photolithography and dry etching, contact holes down to the upper electrodes 52 of the resistance memory elements 54 are formed in the inter-layer insulating film 56.

Next, a barrier metal and a tungsten film are deposited by, e.g., CVD method, and then these conductive films are etched back to form in the inter-layer insulating film 56 the contact plugs 50 electrically connected to the upper electrodes 52 of the resistance memory elements 54 (FIG. 9G).

Figure 9H:
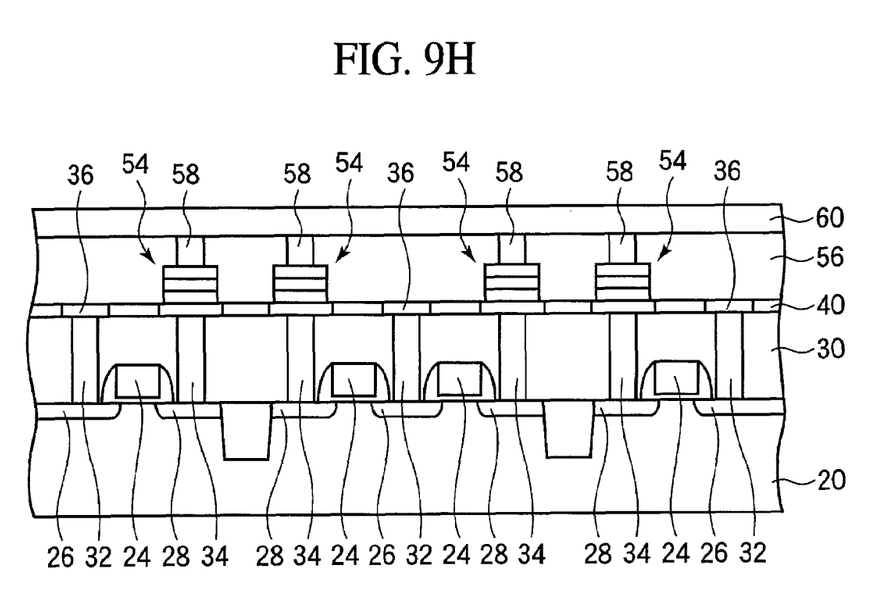

Next, a conductive film is deposited over the inter-layer insulating film 56 with the contact plugs 58 buried in, and then the conductive film is patterned by photolithography and dry etching to form the bit lines 60 electrically connected to the resistance memory elements 54 via the contact plugs 58 (FIG. 9H).

Then, upper level interconnection layers are formed as required, and the nonvolatile semiconductor memory device is completed.

As described above, according to the present embodiment, the resistance memory element which memorizes a high resistance state and a low resistance state and switches between the high resistance state and the low resistance state by an application of voltage has the resistance memory layer formed of the layer structure of materials different from each other, whereby the current value in the writing operation can be drastically decreased. Thus, a nonvolatile semiconductor memory device of high integration and low electric power consumption can be formed.

A Second Embodiment

The resistance memory element and the nonvolatile semiconductor memory device according to a second embodiment of the present invention will be explained with reference to FIG. 10.

The same members of the present embodiment as those of the resistance memory element and the nonvolatile semiconductor memory device according to the first embodiment shown in FIGS. 1 to 9H are represented by the same reference numbers not to repeat or to simplify their explanation.

Figure 10:
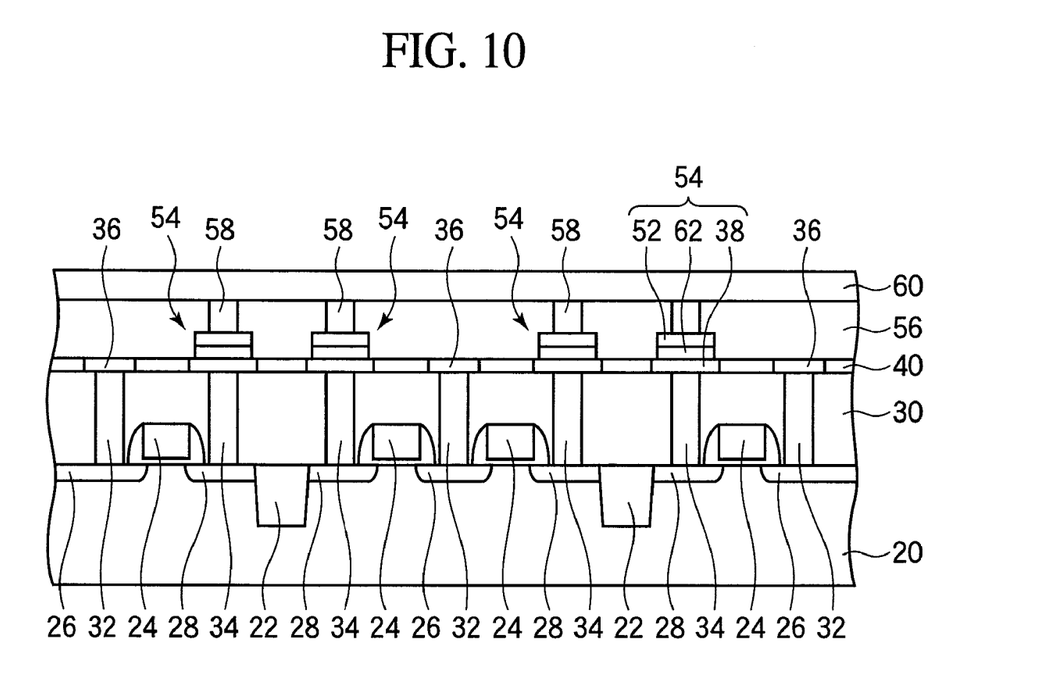
FIG. 10 is a diagrammatic sectional view showing the structure of the nonvolatile semiconductor memory device according to a second embodiment of the present invention.

FIG. 10 is a diagrammatic sectional view showing the structure of the nonvolatile semiconductor memory device according to the present embodiment.

The structure of the nonvolatile semiconductor memory device according to the present embodiment will be explained with reference to FIG. 10. The plane structure and the circuit diagram of the nonvolatile semiconductor memory device according to the present embodiment are the same as those of the nonvolatile semiconductor memory device according to the first embodiment.

Over a silicon substrate 20, a device isolation film 22 for defining device regions is formed. In the device regions of the silicon substrate 20, cell select transistors each including a gate electrode 24 and source/drain regions 26, 28 are formed.

Over the silicon substrate 20 with the cell select transistors formed on, an inter-layer insulating film 30 with contact plugs 32 electrically connected to the source/drain regions 26 and contact plugs 34 electrically connected to the source/drain regions 28 buried in is formed.

Over the inter-layer insulating film 30 with the contact plugs 32, 34 buried in, source lines 36 electrically connected to the source/drain regions 26 via the contact plugs 32, and resistance memory elements 54 electrically connected to the source/drain regions 28 via the contact plugs 34 are formed. The resistance memory elements 54 each includes, as shown in FIG. 10, a lower electrode 38, a resistance memory layer 62 of the mixed layer of $TiO_x$ and $NiO_x$, and an upper electrode 52.

Over the inter-layer insulating film 30 with the source lines 46 and the resistance memory elements 54 formed on, inter-layer insulating films 40, 56 with contact plugs 58 electrically connected to the resistance memory elements 54 buried in are formed.

Over the inter-layer insulating film 56 with the contact plugs 58 buried in, bit lines 60 electrically connected to the upper electrodes 52 of the resistance memory elements 54 via the contact plugs 58 are formed.

As described above, the nonvolatile semiconductor memory device according to the present embodiment is characterized mainly in that the resistance memory layer 62 of the resistance memory elements 54 is formed of the mixed layer of $TiO_x$ and $NiO_x$.

For the effect of accelerating the switching operation in the first embodiment, it is important that the resistance memory layer contains the resistance memory material which accelerates the switching operation, but the resistance memory layer may not essentially have the layer structure, as in the first embodiment. That is, when the resistance memory layer 62 is formed of the mixed layer of $TiO_x$ and $NiO_x$, as in, e.g., the present embodiment, one of the resistance memory materials (, which will be $TiO_x$ in the structure of the present embodiment) acts to accelerate the switching operation. Accordingly, even when the resistance memory layer 62 is formed of the mixed layer of the $TiO_x$ and $NiO_x$, the current value in the setting and the resetting can be decreased.

The resistance memory layer 62 of the mixed layer of $TiO_x$ and $NiO_x$ can be formed by, e.g., cosputtering method or others.

As described above, according to the present embodiment, the resistance memory element which memorizes a high resistance state and a low resistance state and switches between the high resistance state and the low resistance state by an application of voltage has the resistance memory layer formed of the mixed layer of resistance memory materials different from each other, whereby the current value in the writing operation can be drastically decreased. Thus, a nonvolatile semiconductor memory device of high integration and low electric power consumption can be formed.

Modified Embodiments

The present invention is not limited to the above-described embodiments and can cover other various modifications.

For example, in the above-described embodiments, the resistance memory element 54 is formed of the layer structure of the $TiO_x$ and $NiO_x$ and the mixed layer of $TiO_x$ and $NiO_x$, but the resistance memory layer of the resistance memory element is not limited to these structures. As long as the resistance memory layer includes a resistance memory material which plays the role of an oxygen supply source for feeding oxygen for the acceleration of the switching operation, the resistance memory element 54 does not essentially have the structure of the above-described embodiments. For example, the layer film of $ZrO_x$ and $NiO_x$ and the mixed layer of $ZrO_x$ and $NiO_x$ can produced the same effect as in the above-described embodiments.

The resistance memory materials applicable to the invention of the present application are $TiO_x$, $NiO_x$, $YO_x$, $CeO_x$, $MgO_x$, $ZnO_x$, $WO_x$, $NbO_x$, $TaO_x$, $CrO_x$, $MnO_x$, $AlO_x$, $VO_x$, $SiO_x$, etc. In forming the resistance memory layer of the layer structure, in consideration of the properties of these materials, they are suitably combined so that at least one of the combination functions as the oxygen supply source. The resistance memory layer may have the layer structure of three or more layers, or the mixed layer of three or more resistance memory materials.

The resistance memory element of the present invention is applicable widely to nonvolatile semiconductor memory devices using the resistance memory element and is not limited to the structure of the embodiments shown in FIGS. 5 to 8 and 10.

In the above-described embodiment, the lower electrode 38 and the upper electrode 52 of the resistance memory element are formed of platinum film but may be formed of iridium (Ir) or other electrode materials.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A resistance memory element which memorizes a high resistance state and a low resistance state and switches between the high resistance state and the low resistance state by an application of a voltage, comprising:
    a pair of electrodes; and
    a resistance memory layer sandwiched between the pair of electrodes, and including a first layer of a first resistance memory material and a second layer of a second resistance memory material different from the first resistance memory material in direct contact with the first layer,
    wherein the first resistance memory material is a material which accelerates a change of a resistance state of the resistance memory layer.

2. The resistance memory element according to claim 1, wherein
    the first layer is arranged at a cathode side of an electrode of the pair of electrodes, and the second layer is arranged at a anode side of an another electrode of the pair of electrodes.

3. A resistance memory element which memorizes a high resistance state and a low resistance state and switches between the high resistance state and the low resistance state by an application of a voltage, comprising:
    a pair of electrodes; and
    a resistance memory layer sandwiched between the pair of electrodes, and including a first resistance memory material and a second resistance material different from the first resistance memory material, wherein
    the resistance memory layer is a mixed layer of the first resistance memory material and the second resistance memory material, and
    the first resistance memory material is a material which accelerates a change of a resistance state of the resistance memory layer.

4. The resistance memory element according to claim 1, wherein
    the first resistance memory material and the second resistance memory material are material selected from the group consisting of $TiO_x$, $NiO_x$, $YO_x$, $CeO_x$, $MgO_x$, $ZnO_x$, $WO_x$, $NbO_x$, $TaO_x$, $CrO_x$, $MnO_x$, $AlO_x$, $VO_x$, $CuO_x$ and $SiO_x$.

5. The resistance memory element according to claim 1, wherein
    the first resistance memory material is $TiO_x$, and the second resistance memory material is NiO.

6. The resistance memory element according to claim 1, wherein
    the first resistance memory material is ZrO, and the second resistance memory material is NiO.

7. A nonvolatile semiconductor memory device comprising:
    a resistance memory element, which memorizes a high resistance state and a low resistance state and switches between the high resistance state and the low resistance state by an application of a voltage, including:
    a first electrode;
    a resistance memory layer formed on the first electrode and including a first layer of a first resistance memory material and a second layer of a second resistance memory material different from the first resistance memory material in direct contact with the first layer; and
    a second electrode formed on the resistance memory layer,
    wherein the first resistance memory material is a material which accelerates a change of a resistance state of the resistance memory layer.

8. The nonvolatile semiconductor memory device according to claim 7, further comprising:
    a select transistor connected to the first electrode of the resistance memory element;
    a first signal line connected to a gate electrode of the select transistor; and
    a second signal line connected to the second electrode of the resistance memory element.

9. The nonvolatile semiconductor memory device according to claim 7, wherein
    the first resistance memory material and the second resistance memory material are material selected from the group consisting of $TiO_x$, $NiO_x$, $YO_x$, $CeO_x$, $MgO_x$, $ZnO_x$, $WO_x$, $NbO_x$, $TaO_x$, $CrO_x$, $MnO_x$, $AlO_x$, $VO_x$, $CuO_x$ and $SiO_x$.

10. The nonvolatile semiconductor memory device according to claim 7, wherein
    the first resistance memory material is TiO, and the second resistance memory material Is NiO.

11. The nonvolatile semiconductor memory device according to claim 7, wherein
    the first resistance memory material is ZrO, and the second resistance memory material is NiO.

12. The nonvolatile semiconductor memory device according to claim 8, wherein
    the resistance memory element is switched from the low resistance state to the high resistance state by applying a first voltage to the first signal line so that a channel resistance of the select transistor is sufficiently smaller than a resistance value of the resistance memory element in the low resistance state and applying to the second signal line a second voltage necessary for resetting the resistance memory element and less than a voltage necessary for setting the resistance memory element.

13. The nonvolatile semiconductor memory device according to claim 8, wherein
    the resistance memory element is switched from the high resistance state to the low resistance state by applying a first voltage to the high resistance state by applying a first voltage to the first signal line so that a channel resistance of the select transistor is sufficiently smaller than a resistance value of the resistance memory element in the high resistance state and applying to the second signal line a second voltage necessary for setting the resistance memory element.

14. The nonvolatile semiconductor memory device according to claim 8, wherein
    a resistance state of the resistance memory element is read by applying a first voltage to the first signal line to turn on the select transistor, applying to the second signal line a second voltage not more than a voltage for resetting, and detecting a current corresponding to the resistance state of the resistance memory element flowing in the second signal line.

* * * * *